(12) United States Patent
Sun et al.

(10) Patent No.: US 11,269,386 B2
(45) Date of Patent: Mar. 8, 2022

(54) CHASSIS OF SERVER AND SERVER

(71) Applicant: Huawei Technologies Co., Ltd., Shenzhen (CN)

(72) Inventors: Hao Sun, Dongguan (CN); Lv Chen, Shenzhen (CN); Dongming Lu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 42 days.

(21) Appl. No.: 16/986,380

(22) Filed: Aug. 6, 2020

(65) Prior Publication Data

US 2020/0363844 A1 Nov. 19, 2020

Related U.S. Application Data

(63) Continuation of application No. PCT/CN2018/081461, filed on Mar. 30, 2018.

(51) Int. Cl.
*G06F 1/18* (2006.01)
*G06F 1/20* (2006.01)
*H05K 7/20* (2006.01)

(52) U.S. Cl.
CPC .............. *G06F 1/188* (2013.01); *G06F 1/20* (2013.01); *H05K 7/20145* (2013.01)

(58) Field of Classification Search
CPC . G06F 1/188; G06F 1/20; G06F 1/181; G06F 1/186; H05K 7/20145; H05K 7/20727; H05K 2201/042; H05K 7/20; H05K 1/144; G01F 1/6842
USPC ..... 361/692, 679.48, 679.46, 690, 694, 752, 361/796, 679.32; 454/184; 165/80.2, 165/80.3
See application file for complete search history.

(56) References Cited

U.S. PATENT DOCUMENTS

| 10,372,177 B2 * | 8/2019 | Kurosaki .......... H05K 7/20181 |
| 2009/0147452 A1 | 6/2009 | Zhang et al. |
| 2010/0188810 A1 | 7/2010 | Andersen et al. |

(Continued)

FOREIGN PATENT DOCUMENTS

| CN | 101452322 A | 6/2009 |
| CN | 203759635 U | 8/2014 |

(Continued)

OTHER PUBLICATIONS

Wang, K., et al., "Thermal Simulation Analysis of the Heat Rejection System of ATCA Server",Computer and Digital Engineering,vol. 38 No. 12, Dec. 20, 2010, 4 pages.

*Primary Examiner* — Mandeep S Buttar
(74) *Attorney, Agent, or Firm* — Conley Rose, P.C.

(57) ABSTRACT

A chassis of a server comprises a backplane. The backplane is disposed in the chassis of the server, and the backplane includes a first sub-board, a second sub-board, and at least one air baffle. The first sub-board is isolated from the second sub-board. Each air baffle forms an included angle with the first sub-board and forms an included angle with the second sub-board. Space enclosed by the first sub-board, the second sub-board, and a side wall, an upper wall, and a lower wall of the chassis is divided into a first air cavity and at least one second air cavity by using the at least one air baffle. The first air cavity is used for at least one first module to dissipate heat, and the second air cavity is used for at least one second module to dissipate heat.

20 Claims, 8 Drawing Sheets

(56) References Cited

U.S. PATENT DOCUMENTS

| | | |
|---|---|---|
| 2014/0071618 A1 | 3/2014 | Tian et al. |
| 2014/0092541 A1 | 4/2014 | Zhang et al. |
| 2015/0153792 A1 | 6/2015 | Chen |

FOREIGN PATENT DOCUMENTS

| | | |
|---|---|---|
| CN | 104142718 A | 11/2014 |
| CN | 104679163 A | 6/2015 |
| CN | 205485820 U | 8/2016 |
| CN | 206224360 U | 6/2017 |
| CN | 206411572 U | 8/2017 |
| CN | 207571681 U | 7/2018 |
| JP | 2016025327 A | 2/2016 |

\* cited by examiner

CHASSIS OF SERVER AND SERVER

CROSS-REFERENCE TO RELATED APPLICATIONS

This is a continuation of Int'l Patent App. No. PCT/CN2018/081461 filed on Mar. 30, 2018, which is incorporated by reference.

TECHNICAL FIELD

This disclosure relates to the server field, and in particular, to a chassis of a server and a server.

BACKGROUND

A server is a device for providing a computing service. To provide a highly reliable service, there are relatively high requirements on a processing capability, stability, reliability, security, scalability, manageability, and the like of the server.

To meet the requirements, a module (for example, a processor) in the server needs to maintain stable operating performance. To achieve stable operating performance of the module, chassis of the server needs to meet heat dissipation requirements of modules.

Currently, more modules are configured in the server. When an architecture of the chassis of the server is designed, a power supply air cavity is disposed in a system air cavity, so that the power supply air cavity shares heat dissipation space with the system air cavity of another component. However, in this design, the power supply air cavity is coupled to the system air cavity. Heat of a high-power supply module (for example, the processor) needs to be dissipated first by using airflow, and then heat of another module (for example, a power supply) is dissipated by using the airflow. This affects a heat dissipation capability and a power supply evolution capability of the power supply, and affects heat dissipation performance of the entire server.

Therefore, how to improve heat dissipation performance of the chassis of the server becomes a problem to be urgently resolved.

SUMMARY

This disclosure provides a chassis of a server and a server. A heat dissipation structure of the chassis of the server can improve heat dissipation performance of the server.

According to a first aspect, a chassis of a server is provided. The chassis of the server includes a backplane. The backplane is disposed in the chassis of the server, and the backplane includes a first sub-board, a second sub-board, and at least one air baffle. The first sub-board is isolated from the second sub-board, the first sub-board is parallel to the second sub-board, and both the first sub-board and the second sub-board are perpendicular to a side wall of the chassis of the server. The at least one air baffle is located between the first sub-board and the second sub-board, and each of the at least one air baffle forms an included angle with the first sub-board and forms an included angle with the second sub-board. Space enclosed by the first sub-board, the second sub-board, and the side wall, an upper wall, and a lower wall of the chassis is divided into a first air cavity and at least one second air cavity by using the at least one air baffle. A hole used for air circulation is disposed in an area enclosing the first air cavity, and the first air cavity is used for at least one first module to dissipate heat. Each of the at least one first module is connected to the first sub-board by using an interface that is of the first sub-board and that is in an air intake vent area of the first air cavity. A hole used for air circulation is disposed in an area enclosing each second air cavity, and the second air cavity is used for at least one second module to dissipate heat. Each of the at least one second module is connected to the second sub-board by using an interface that is of the second sub-board and that is in an air exhaust vent area of the second air cavity.

Compared with a heat dissipation structure of a chassis of a conventional server, the backplane is disposed as a structure of two isolated sub-boards, so that a cavity is formed between the two sub-boards. The at least one air baffle is disposed between the two sub-boards, to divide the cavity into the first air cavity that is used for the first module to dissipate heat and the second air cavity that is specially used for the second module to dissipate heat. In other words, the first module and the second module each have an independent heat dissipation air cavity. Therefore, independent heat dissipation of the first module and the second module is implemented. This improves heat dissipation efficiency of the first module and that of the second module, and further improves heat dissipation performance of the entire server.

In a possible implementation, the first air cavity is enclosed by a first part of the first sub-board, a first part of the second sub-board, a first part of the upper wall of the chassis, a first part of the lower wall, and the air baffle. That the hole used for air circulation is disposed in the area enclosing the first air cavity includes: A first hole is disposed in the first part of the first sub-board, a second hole is disposed in the first part of the second sub-board, and in the first air cavity, airflow enters the first air cavity from the first hole in the first sub-board, and flows out of the first air cavity through the second hole in the second sub-board.

The first hole is disposed on the first sub-board, and the second hole is disposed on the second sub-board. The airflow that takes heat of the first module away can enter the first air cavity from the first hole, and flow out of the first air cavity through the second hole. Finally, the airflow flows out of the chassis through an air exhaust vent of the chassis of the server. Therefore, the first air cavity can be used for the first module to dissipate heat.

In another possible implementation, when the first air baffle intersects with the side wall of the chassis of the server, the second air cavity is enclosed by a second part of the second sub-board, a second part of the side wall of the chassis of the server, a second part of the upper wall, a second part of the lower wall, and the first air baffle. The first air baffle is any one of the at least one air baffle.

In another possible implementation, when the first air baffle does not intersect with the side wall of the chassis of the server, the second air cavity is enclosed by a second part of the first sub-board, a second part of the second sub-board, a second part of the side wall of the chassis of the server, a second part of the upper wall, a second part of the lower wall, and the first air baffle.

In another possible implementation, that the hole used for air circulation is disposed in the area enclosing the second air cavity includes: A third hole is disposed in the second part of the second sub-board, a fourth hole is disposed in the second part of the side wall of the chassis, and in the second air cavity, airflow enters the second air cavity from the fourth hole in the side wall of the chassis, and flows out of the second air cavity through the third hole in the second sub-board.

The fourth hole is disposed on the side wall of the chassis, and the third hole is disposed on the second sub-board. The airflow can enter the second air cavity from the fourth hole, and flow out of the second air cavity through the third hole. Finally, the airflow passes through the at least one second module to take heat of the second module away, and flows out of the chassis. Therefore, the second air cavity can be used for the second module to dissipate heat.

In another possible implementation, that the hole used for air circulation is disposed in the area enclosing the second air cavity includes: A third hole is disposed in the second part of the second sub-board, a fourth hole is disposed in the second part of the side wall of the chassis, a fifth hole is disposed in the second part of the upper wall of the chassis, and in the second air cavity, airflow enters the second air cavity from the fourth hole and/or the fifth hole, and flows out of the second air cavity through the third hole in the second sub-board.

The fourth hole is disposed on the side wall of the chassis, the fifth hole is disposed in the second part of the upper wall of the chassis, and the third hole is disposed on the second sub-board. The airflow can enter the second air cavity from the fourth hole and/or the fifth hole, and flow out of the second air cavity through the third hole. Finally the airflow passes through the at least one second module to take the heat of the second module away, and flows out of the chassis. Therefore, the second air cavity can be used for the second module to dissipate heat.

In another possible implementation, a value of a spacing between the first sub-board and the second sub-board belongs to a preset set, and the value of the spacing between the first sub-board and the second sub-board is related to a size of the chassis of the server and/or a module layout inside the chassis.

For example, a minimum distance between the first sub-board and the second sub-board is 20 mm or 25 mm, and a maximum distance between the first sub-board and the second sub-board is 50 mm or 60 mm.

It should be understood that a distance between the two sub-boards determines sizes of the two air cavities. The size of the air cavity can affect resistance and an air speed of the air cavity, and further affect heat dissipation performance. During actual application, the spacing between two sub-boards is determined based on factors such as an actual depth of a chassis, an architecture of the chassis, and a size of the chassis.

In another possible implementation, the first sub-board is connected to the second sub-board by using a busbar component, and the busbar component is configured to supply power to the second sub-board.

In another possible implementation, a fastening support bracket is disposed between the first sub-board and the second sub-board, and the fastening support bracket is configured to fasten the first sub-board and the second sub-board, to form the spacing between the first sub-board and the second sub-board.

In another possible implementation, a hole opening rate of the first sub-board is greater than a first hole opening rate threshold, and a hole opening rate of the second sub-board is greater than a second hole opening rate threshold. The hole opening rate of the first sub-board is used to indicate a ratio of a sum of areas of all holes on the first sub-board to an area of the first sub-board, and the hole opening rate of the second sub-board is used to indicate a ratio of a sum of areas of all holes on the second sub-board to an area of the second sub-board.

In another possible implementation, when the areas of all the holes are the same, the hole opening rate of the first sub-board may also indicate a quantity of holes per unit area of the first sub-board. Similarly, the hole opening rate of the second sub-board may also indicate a quantity of holes per unit area of the second sub-board.

It should be understood that the first hole opening rate threshold or the second hole opening rate threshold may be a maximum hole opening rate of an existing single-layer backplane or a closely-bonded two layers of backplanes. For example, based on a service requirement, the first hole opening rate threshold and the second hole opening rate threshold are 20%.

In a single-layer backplane structure of the conventional server, a signal and a power supply need to be routed on the backplane at the same time. Therefore, there is limitation on opening a hole, and a hole opening rate is relatively small, for example, is only 10%. However, in a two-layer structure design, the signal and the power supply are separately routed on different sub-boards, and less routing is required on a single sub-board. Therefore, there is less limitation on opening a hole, and the hole opening rate is increased. Because the hole opening rate of the sub-board is relatively large, resistance of the air cavity to the airflow can be reduced. This ensures smooth airflow in the chassis and improves heat dissipation performance of the server.

It should be understood that, during actual application, a specific value of the first hole opening rate threshold and that of the second hole opening rate threshold may be determined based on an actual situation.

In another possible implementation, each of the at least one first module may include a central processing unit (CPU) module or a graphics processing unit (GPU) module. Each of the at least one second module is provided with an independent fan.

It should be understood that the second module may further include another module. For example, the second module may further include a switching module.

For example, the second module may include a power supply module, an input/output (I/O) module, a source-measure unit (SMU) module, a serial digital interface (SDI) module, a field-programmable gate array (FPGA) heterogeneous computation module, or the like. Other embodiments are possible, provided that heat of the second module is dissipated independently and provided that the second module has an independent fan that actively dissipates heat.

The CPU module and the CPU module may be collectively referred to as a computation module.

The power supply module can be decoupled from the computation module, to implement independent heat dissipation of the power supply module and the computation module. Therefore, heat accumulation between the power supply module and the computation module can be avoided, and heat dissipation performance of the server can be improved.

In another possible implementation, the chassis is divided, by using the backplane, into first space in contact with the first sub-board and second space in contact with the second sub-board. The first module is located in the first space in the chassis, and the second module is located in the second space in the chassis.

Specifically, in the conventional server, the second module and the first module (for example, the power supply module and the computation module) are usually deployed in a same area in the chassis. As a result, the power supply module occupies heat dissipation space of the computation module, and there is heat accumulation. This affects heat dissipation of the power supply module. However, the first module and the second module are separated and independent of each other, and heat dissipation space of the first module is not coupled to that of the second module. This can implement independent heat dissipation of the two modules.

In another possible implementation, the first sub-board is a power supply backplane, and the second sub-board is a signal backplane.

The power supply backplane may be configured to be connected to the power supply module, and convert a voltage to supply power to modules. The signal backplane may be used for communication between the modules in a system.

Therefore, the backplane in the server is disposed as a double-layer structure in which the power supply backplane and the signal backplane are combined. There is a specific spacing between the signal backplane and the power supply backplane, and the cavity is divided, by using the air baffle, into the first air cavity that is used for the first module to dissipate heat and the second air cavity that is used for the second module to dissipate heat. The first module and the second module each have an independent heat dissipation air cavity. Therefore, independent heat dissipation of the first module connected to the power supply backplane and the second module connected to the signal backplane is implemented. This reduces load of a heat dissipation structure of the system and improves heat dissipation performance of the entire server.

In another possible implementation, the server is a rack server or a blade server.

According to a second aspect, a server is provided. The server includes a chassis, at least one first module, and at least one second module. The chassis includes a backplane. The backplane is disposed in the chassis, and the backplane includes a first sub-board, a second sub-board, and at least one air baffle. The first sub-board is isolated from the second sub-board, the first sub-board is parallel to the second sub-board, and both the first sub-board and the second sub-board are perpendicular to a side wall of the chassis of the server. The at least one air baffle is located between the first sub-board and the second sub-board, and each of the at least one air baffle forms an included angle with the first sub-board and forms an included angle with the second sub-board. Space enclosed by the first sub-board, the second sub-board, and the side wall, an upper wall, and a lower wall of the chassis is divided into a first air cavity and at least one second air cavity by using the at least one air baffle. A hole used for air circulation is disposed in an area enclosing the first air cavity, and the first air cavity is used for the at least one first module to dissipate heat. Each of the at least one first module is connected to the first sub-board by using an interface that is of the first sub-board and that is in an air intake vent area of the first air cavity. A hole used for air circulation is disposed in an area enclosing each second air cavity, and the second air cavity is used for the at least one second module to dissipate heat. Each of the at least one second module is connected to the second sub-board by using an interface that is of the second sub-board and that is in an air exhaust vent area of the second air cavity.

Compared with a heat dissipation structure of a chassis of a conventional server, the backplane is disposed as a structure of two isolated sub-boards, so that a cavity is formed between the two sub-boards. The at least one air baffle is disposed between the two sub-boards, to divide the cavity into the first air cavity that is used for the first module to dissipate heat and the second air cavity that is specially used for the second module to dissipate heat. In other words, the first module and the second module each have an independent heat dissipation air cavity. Therefore, independent heat dissipation of the first module and the second module is implemented. This improves heat dissipation efficiency of the first module and that of the second module, and further improves heat dissipation performance of the entire server.

For a structure of the chassis of the server in the second aspect, refer to the structure of the chassis of the server in the first aspect. Details are not described herein again.

The implementations provided in the foregoing aspects may be further combined to provide more implementations.

DESCRIPTION OF EMBODIMENTS

The following describes the technical solutions with reference to the accompanying drawings.

Figure 1:
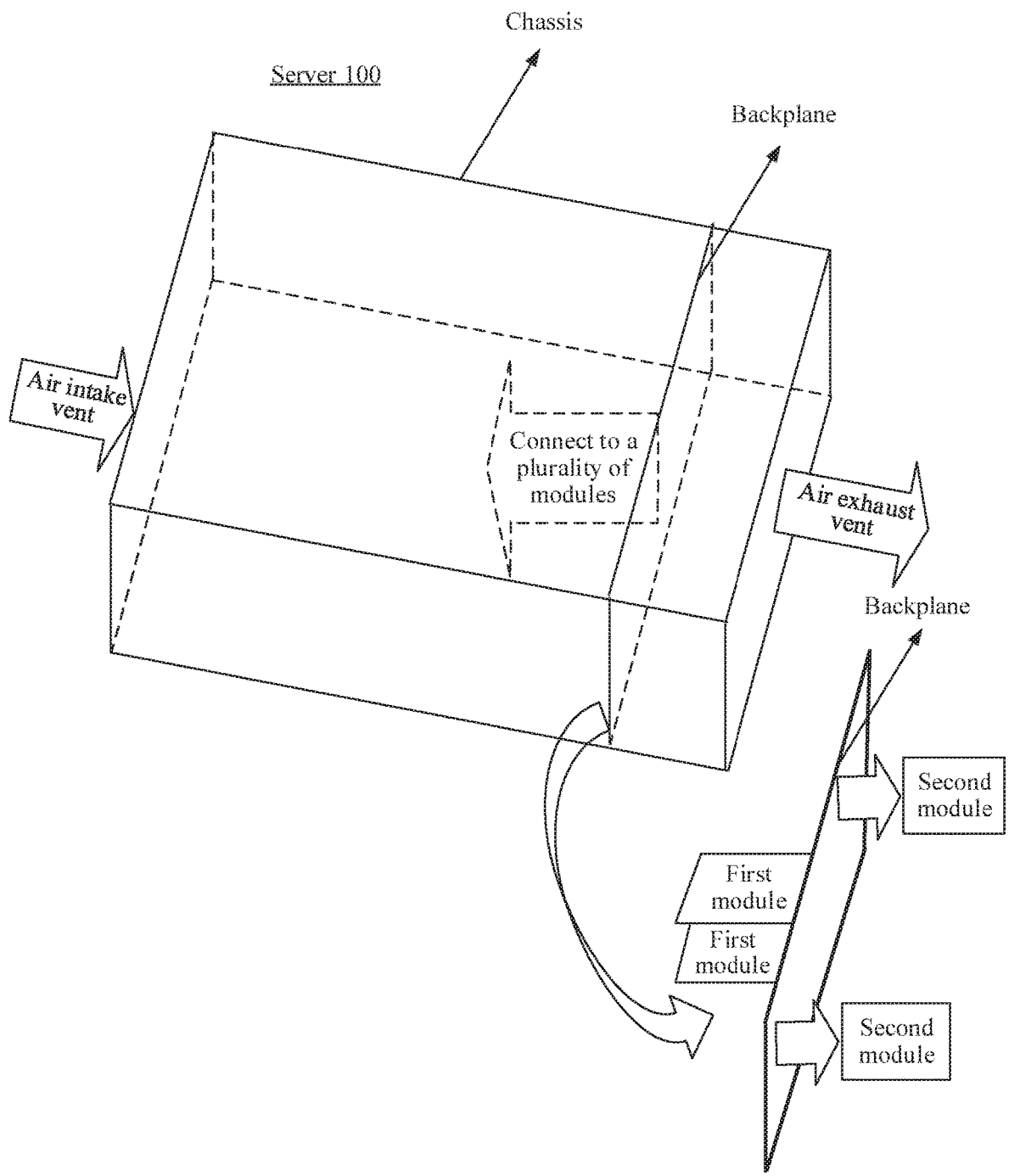
FIG. 1 is a schematic structural diagram of a conventional server.

FIG. 1 is a schematic structural diagram of a conventional server. A backplane and a plurality of modules connected to the backplane are disposed in a chassis of a server 100 shown in FIG. 1.

In FIG. 1, the backplane and the module may be connected by using a connector. For example, the connector may be a high-density connector. Interfaces for interconnection may be disposed on the backplane and each of the plurality of modules. The plurality of modules may be directly connected to the backplane, or may be connected to the backplane by using a cable. In addition, the backplane in FIG. 1 may be a single-layer backplane, or may be a closely-bonded two layers of backplanes.

The plurality of modules may include at least one first module and at least one second module. The first module may also be referred to as a computation module or a computing node. The first module may include a CPU module or a GPU module. The second module is a module having an independent fan, and includes any one of a power supply module, an I/O module, an SMU module, an SDI module, and an FPGA heterogeneous computation module. A specific form of the second module in this embodiment is not limited to the content described above.

As shown in FIG. 1, the first module may be disposed on one side of the backplane, and the second module may be disposed on the other side of the backplane.

As shown in FIG. 1, the first module (for example, the CPU or the GPU) and the second module (for example, the power supply module) in the chassis of the conventional server are disposed in a same heat dissipation air cavity (which may also be referred to as a system air cavity). In other words, the plurality of modules shares one heat dissipation air cavity. In the chassis with the foregoing arrangement, an air cavity of the first module is usually coupled with an air cavity of the second module. Therefore, a direction of heat dissipation airflow in the server shown in FIG. 1 is as follows: The heat dissipation airflow may enter the chassis from one end of the chassis of the server (which may also be referred to as a front end of the server), and pass through the modules. For example, the heat dissipation airflow first passes through the first module, then passes through the second module, and flows out of the chassis from the other end of the chassis (which may also be referred to as a rear end of the server).

It should be understood that in this embodiment, the term "air cavity" may indicate a carrier for airflow circulation.

It can be learned from FIG. 1 that heat dissipation of the plurality of modules in a heat dissipation structure of the chassis of the server results in heat accumulation. Specifically, after the heat dissipation airflow enters the chassis of the server from an air intake vent of the server, heat of each module is taken away each time the airflow passes through the module, and a temperature of the airflow increases as a quantity of modules through which the airflow passes increases. In addition, as a computing capability of the server is enhanced, power consumption density is gradually increased, and power consumption of a high-power module (such as the CPU and the GPU) is increasingly high. Therefore, for a module close to the rear end (an air exhaust vent) of the server, for example, the second module (for example, the power supply module), after the airflow first passes through the first module (for example, the CPU), heat of the first module is taken away, and the temperature of the airflow in the chassis of the server increases. In this case, a cooling effect of the airflow becomes poor. This does not facilitate heat dissipation of a module at the rear end, and affects heat dissipation performance of the entire server.

It should be noted that although the modules such as the power supply module have independent fans, there is only one air intake vent of the server, and the fans can only control an airflow direction, and cannot control a sequence of the modules through which the airflow passes in a same air cavity.

In view of the mentioned problems, an embodiment provides a chassis of a server. In the chassis of the server, an air cavity of a first module is decoupled from an air cavity of a second module, and the first module and the second module each may dissipate heat by using an independent air cavity. Therefore, according to the technical solutions provided in the embodiments, heat accumulation between the first module and the second module can be avoided, and heat dissipation efficiency of the first module and that of the second module, and heat dissipation performance of the entire server are improved.

Figure 2:
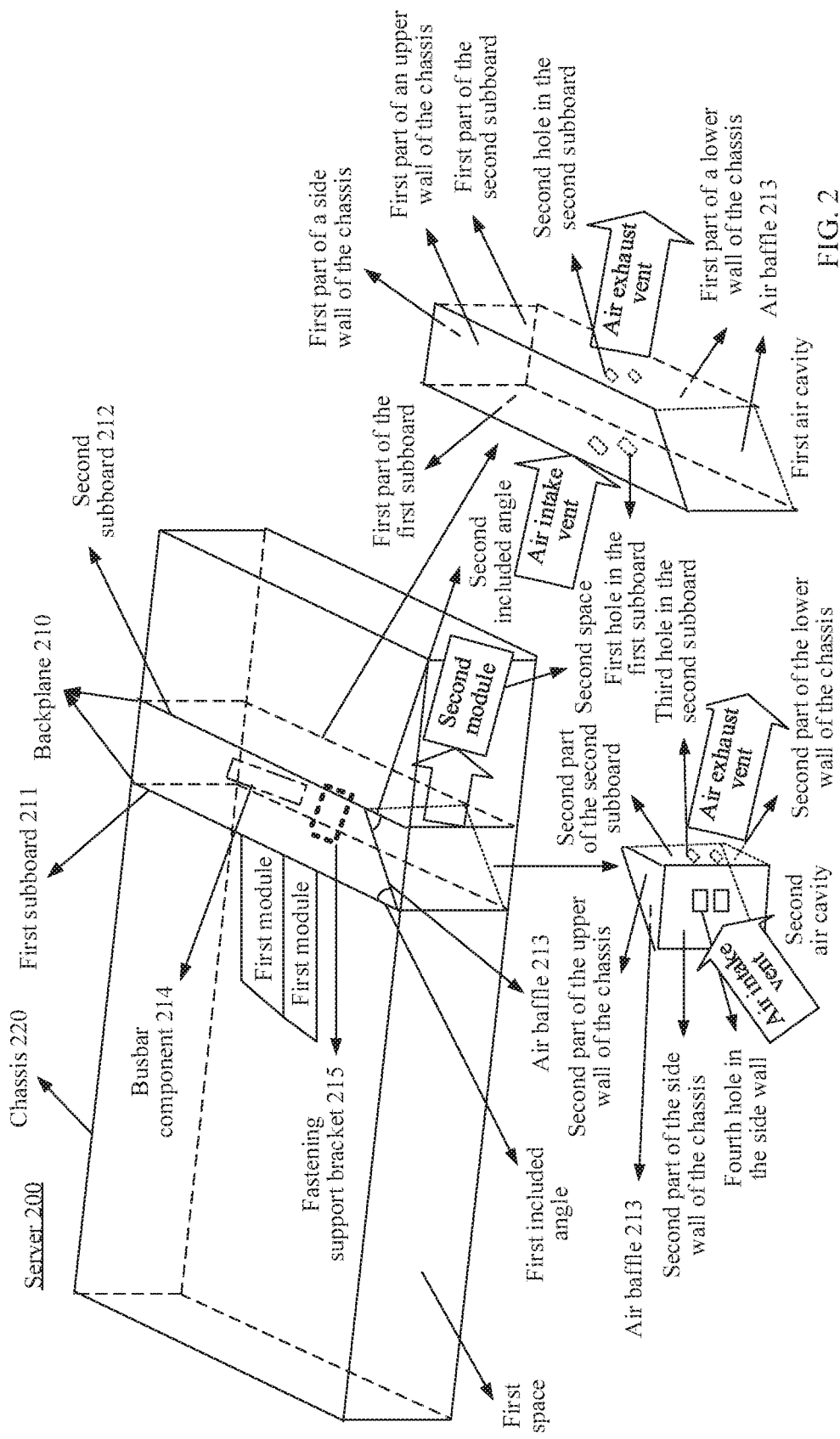
FIG. 2 is a schematic structural diagram of a server according to an embodiment.

For ease of understanding and description, as an example instead of a limitation, the following describes in detail an architecture of a server in the embodiments with reference to the accompanying drawings. FIG. 2 is a schematic structural diagram of a chassis of a server according to an embodiment. As shown in FIG. 2, a chassis 220 of a server 200 includes a backplane 210, and the backplane 210 further includes a first sub-board 211, a second sub-board 212, and an air baffle 213. The first sub-board 211 is isolated from the second sub-board 212, the first sub-board 211 is parallel to the second sub-board 212, and both the first sub-board 211 and the second sub-board 212 are perpendicular to a side wall of the chassis of the server. The air baffle 213 is located between the first sub-board 211 and the second sub-board 212, and the air baffle 213 forms an included angle with the first sub-board 211 and forms an included angle with the second sub-board 212.

At least one air baffle 213 (one air baffle 213 is used as an example in FIG. 2) divides space enclosed by the first sub-board 211, the second sub-board 212, and the side wall, an upper wall, and a lower wall of the chassis 220 into a first air cavity and at least one second air cavity (FIG. 2 shows an example of only one second air cavity). A hole used for air circulation is disposed in an area enclosing the first air cavity, and the first air cavity is used for at least one first module to dissipate heat. Each first module is connected to the first sub-board by using an interface that is of the first sub-board and that is in an air intake vent area of the first air cavity. A hole used for air circulation is disposed in an area enclosing each of the second air cavity, and the second air cavity is used for at least one second module to dissipate heat. Each second module is connected to the second sub-board by using an interface that is of the second sub-board and that is in an air exhaust vent area of the second air cavity.

Two included angles are respectively formed between the air baffle 213 and the first sub-board 211 and between the air baffle 213 and the second sub-board 212. A first included angle is formed between the air baffle 213 and the first sub-board 211, and a second included angle is formed between the air baffle 213 and the second sub-board 212.

In a possible embodiment, the air baffle 213 intersects with the first sub-board 211 to form an included angle and intersects with the second sub-board 212 to form an included angle. The air baffle 213 may intersect with the first sub-board and the second sub-board in a plurality of forms. When the air baffle forms an included angle with the first sub-board and forms an included angle with the second sub-board, but when the air baffle intersects with the side wall, the side wall, the upper wall, and the lower wall of the chassis, the first sub-board, and the second sub-board may form different second air cavities in various combinations. For example, as shown in FIG. 2, the air baffle 213 separately intersects with the first sub-board 211, the side wall of the chassis, and the second sub-board 212 on a straight line. When the air baffle forms an included angle with the first sub-board and forms an included angle with the second sub-board, but when the air baffle does not intersect with the side wall, the side wall, the upper wall, and the lower wall of the chassis, the first sub-board, and the second sub-board may form different second air cavities in various combinations, and a hole may be opened in a different manner.

Optionally, the first sub-board 211 is connected to the second sub-board 212 by using a busbar component 214, and the busbar component 214 is configured to supply power to the second sub-board 212. A signal may be transferred between the first sub-board 211 and the second sub-board 212 by using the busbar component 214.

Optionally, a fastening support bracket 215 is disposed between the first sub-board 211 and the second sub-board 212, and the fastening support bracket 215 is configured to support the first sub-board 211 and the second sub-board 212, to form a spacing between the first sub-board 211 and the second sub-board 212.

Optionally, a value of the spacing between the first sub-board 211 and the second sub-board 212 belongs to a preset set, and the value of the spacing between the first sub-board and the second sub-board is related to a size of the chassis of the server and/or a module layout inside the chassis. For example, a minimum value of the preset set may be 20 mm, 25 mm, or the like, and a maximum value of the preset set may be 50 mm or 60 mm.

It should be understood that a distance between the two sub-boards affects sizes of the two air cavities. The size of the air cavity can affect resistance and an air speed of the air cavity, and further affect heat dissipation performance. During actual application, a spacing between two sub-boards is determined based on factors such as an actual size parameter of a chassis (for example, a depth of the chassis, namely, a distance from a front end of the chassis to a rear end of the chassis) and/or a module layout inside the chassis.

Figure 6:
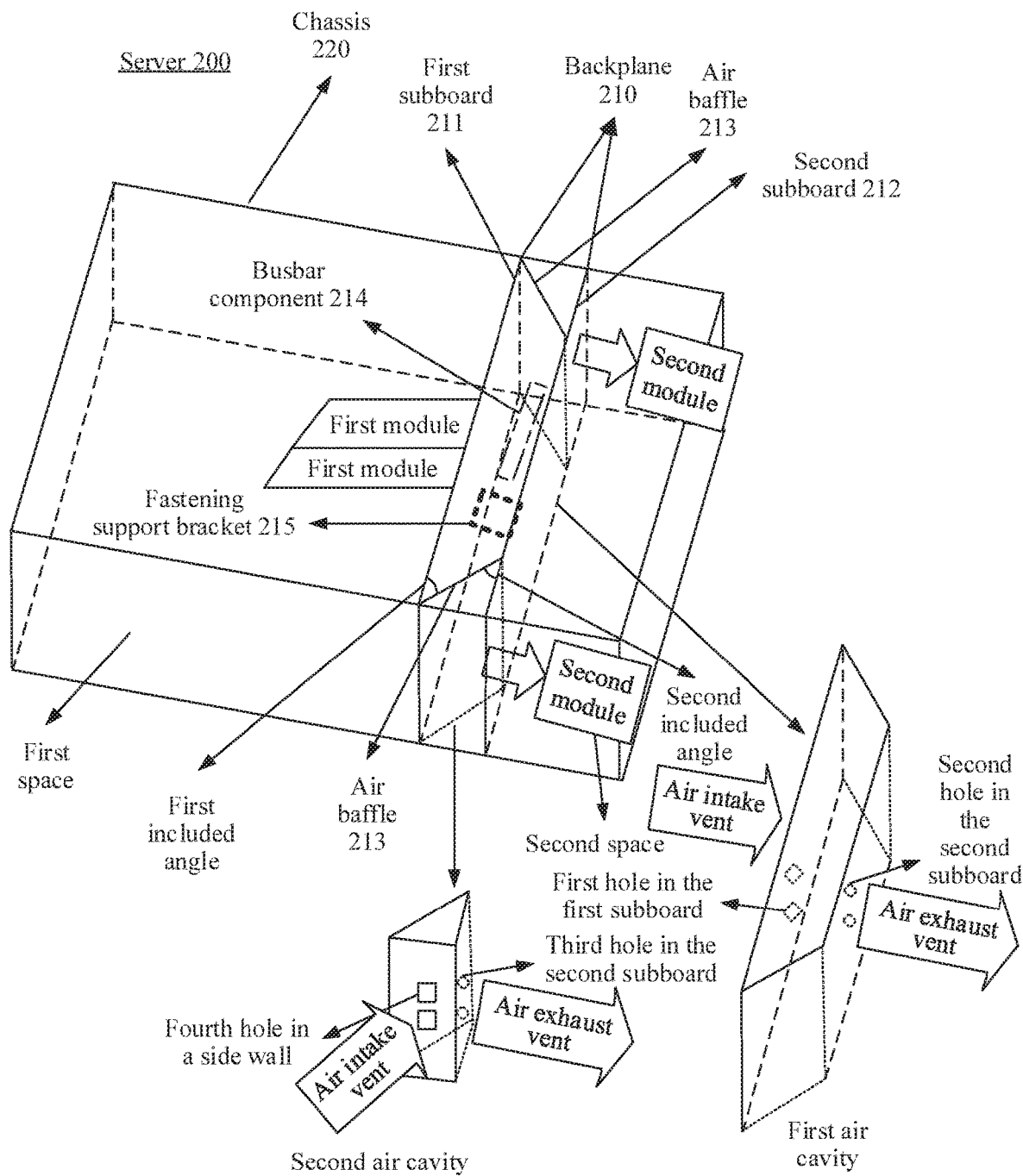
FIG. 6 is another schematic structural diagram of a server according to an embodiment.
Figure 7:
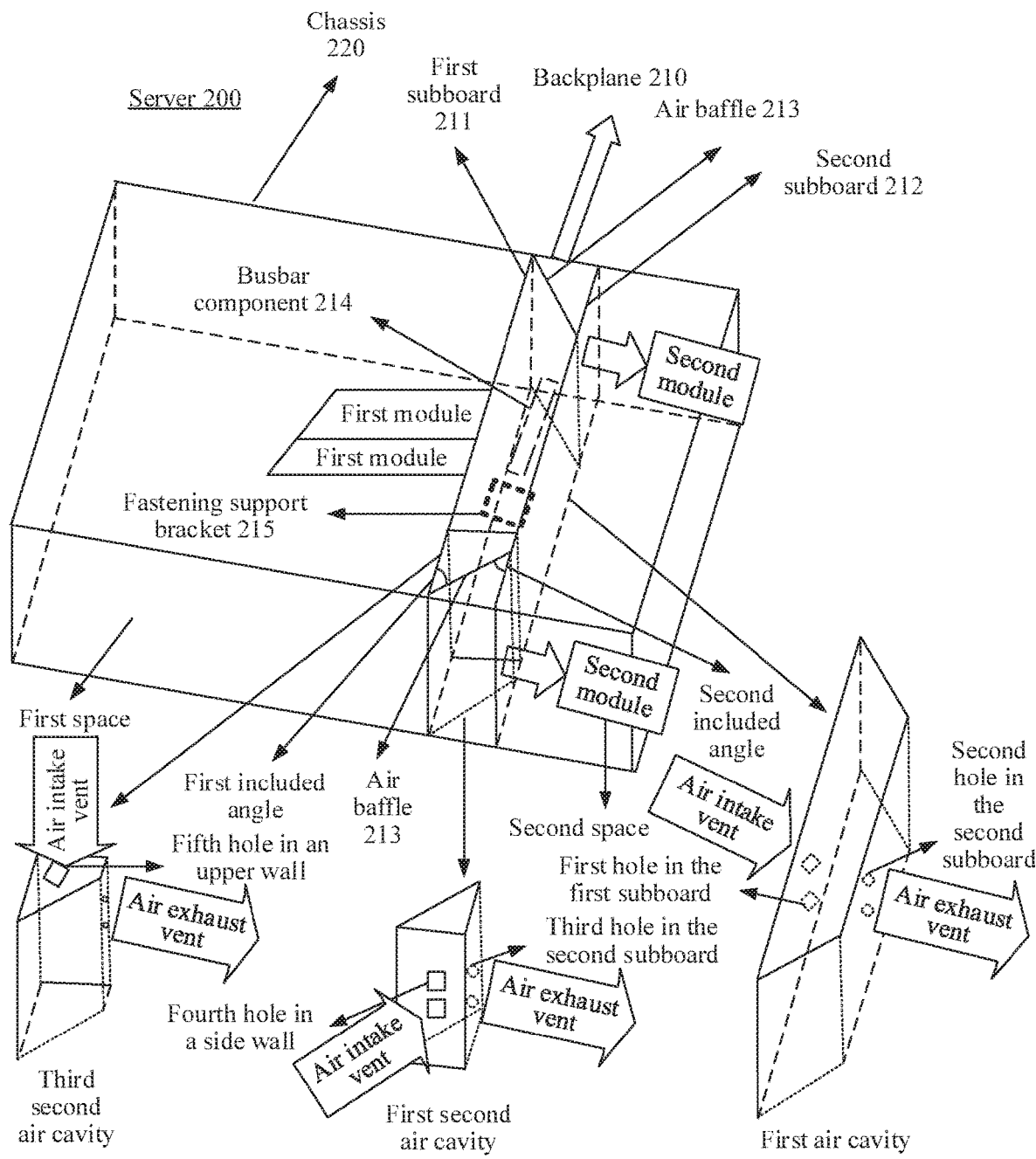
FIG. 7 is another schematic structural diagram of a server according to an embodiment.

It should be understood that FIG. 2 shows an example in which the backplane in the chassis includes one air baffle 213. However, this embodiment is not limited thereto. For example, the backplane may include two air baffles (as shown in FIG. 6), or the backplane may include three air baffles (as shown in FIG. 7), or the backplane includes more air baffles.

Figure 3:
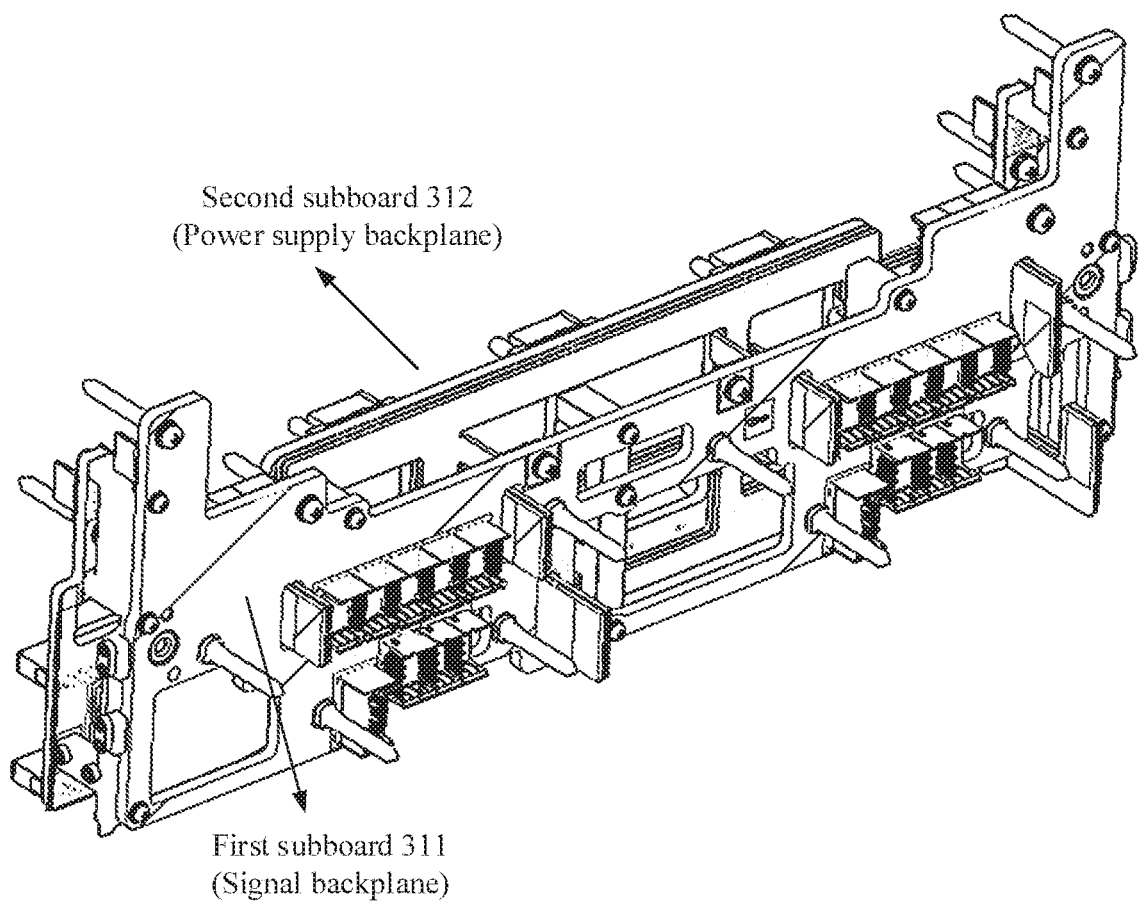
FIG. 3 is a schematic diagram of a backplane structure according to an embodiment.
Figure 4:
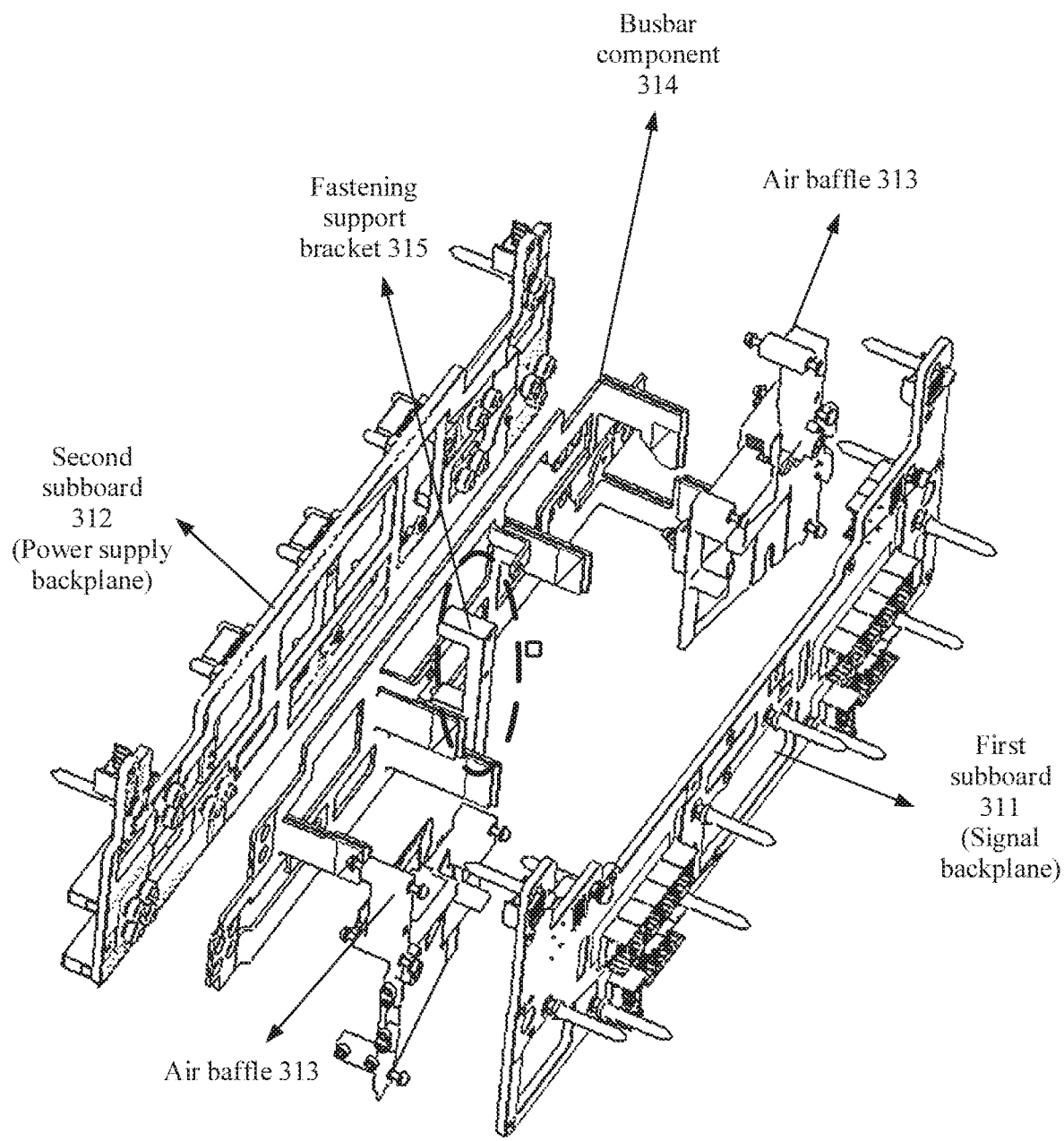
FIG. 4 is an exploded diagram of a backplane structure according to an embodiment.
Figure 5:
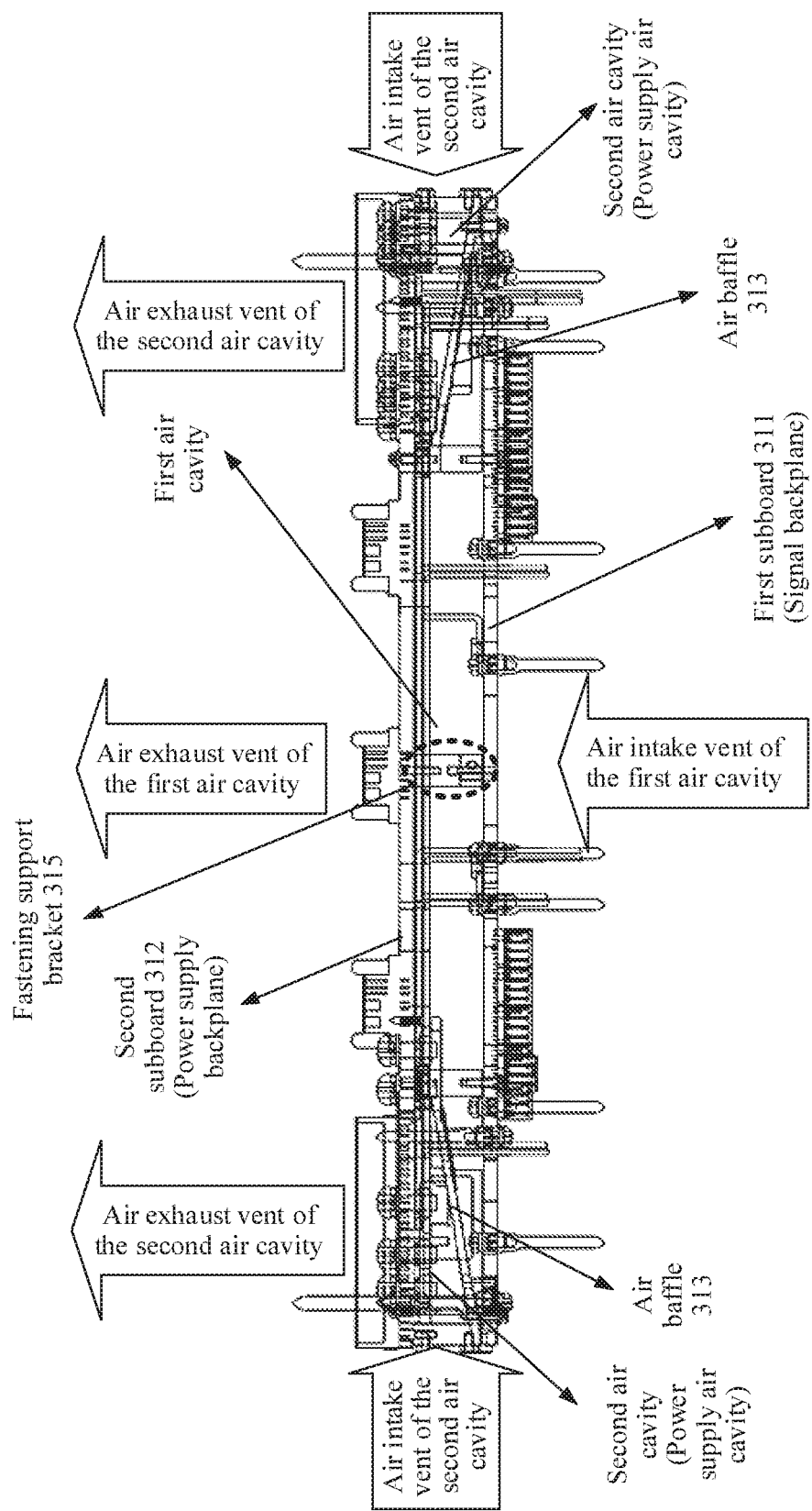
FIG. 5 is a top view of a backplane structure according to an embodiment.

For example, the following describes, with reference to FIG. 3 to FIG. 5, a specific structure of a backplane including two air baffles. FIG. 3 is a schematic diagram of a backplane structure according to an embodiment, FIG. 4 is an exploded diagram of the backplane structure according to an embodiment, and FIG. 5 is a top view of the backplane structure according to an embodiment.

The backplane 300 shown in FIG. 3 to FIG. 5 includes a first sub-board 311, a second sub-board 312, and two air baffles 313. The first sub-board 311 in FIG. 3 to FIG. 5 may correspond to the first sub-board 211 in FIG. 2, FIG. 6, and FIG. 7. The second sub-board 312 in FIG. 3 to FIG. 5 may correspond to the second sub-board 212 in FIG. 2, FIG. 6, and FIG. 7. The air baffle 313 in FIG. 3 to FIG. 5 may correspond to the air baffle 213 in FIG. 2, FIG. 6, and FIG. 7. As shown in FIG. 3 and FIG. 5, there is an included angle between the air baffle 313 and the first sub-board 311 and an included angle between the air baffle 313 and the second sub-board 312. Therefore, the air baffle 313 may be referred to as an inclined part.

As shown in FIG. 3 and FIG. 5, the first sub-board 311 is isolated from the second sub-board 312. In other words, a specific distance is set between the first sub-board and the second sub-board. For example, the spacing may be 25 mm, 30 mm, 3.5 mm, or the like.

As shown in FIG. 3 and FIG. 5, the first sub-board 311 is connected to the second sub-board 312 by using a busbar component 314. The busbar component 314 is configured to supply power to the second sub-board 312. A signal may be transferred between the first sub-board 311 and the second sub-board 312 by using the busbar component 314.

Optionally, a fastening support bracket 315 is disposed between the first sub-board 311 and the second sub-board 312, and the fastening support bracket 315 is configured to fasten the first sub-board 311 and the second sub-board 312. For example, as shown in FIG. 4, the fastening support bracket 315 is a structure in an inverted-F shape, and the fastening support bracket may alternatively be in another shape.

The two air baffles 313 are located between the first sub-board 311 and the second sub-board 312, and are separately disposed at a position close to a side wall of a chassis of a server.

In the following, a structure of the first air cavity and that of the second air cavity in the chassis are further described with reference to FIG. 2.

The first air cavity is enclosed by a first part of the first sub-board 211, a first part of the second sub-board 212, a first part of the upper wall of the chassis, a first part of the lower wall, and the air baffle 213. It should be understood that, in FIG. 2, when only one air baffle is disposed in the chassis of the server, the area enclosing the first air cavity further needs to include a first part of the side wall of the chassis. In the following, as shown in FIG. 3, the area enclosing the first air cavity may not include the side wall of the chassis.

A first hole is disposed in the first part of the first sub-board 211, and a second hole is disposed in the first part of the second sub-board 212. In the first air cavity, airflow enters the first air cavity from the first hole, and flows out of the first air cavity through the second hole.

It should be understood that, as shown in FIG. 2, when the air baffle intersects with the side wall of the chassis of the server, the first part of the first sub-board may be all of the first sub-board. When the air baffle does not intersect with the side wall of the chassis of the server, the first part of the first sub-board may include an area that is on the first sub-board and that encloses the first air cavity.

The second air cavity may be enclosed by an area in any one of the following manners:

Manner 1: When the air baffle 213 intersects with the side wall of the chassis of the server, the second air cavity is enclosed by a second part of the second sub-board 212, a second part of the side wall of the chassis of the server, a second part of the upper wall, a second part of the lower wall, and the air baffle 213. A cross section of the second air cavity is in a triangle shape. FIG. 2 shows a schematic structural diagram of the second air cavity in the manner 1.

It should be understood that the second part of the second sub-board is an area that is on the second sub-board and that encloses the second air cavity. Similarly, the second part of the side wall of the chassis is an area that is on the side wall and that encloses the second air cavity, the second part of the upper wall is an area that is on the upper wall and that encloses the second air cavity, and the second part of the lower wall is an area that is on the lower wall and that encloses the second air cavity.

Manner 2: When the air baffle 213 does not intersect with the side wall of the chassis of the server, the second air cavity is enclosed by a second part of the first sub-board 211, the second part of the second sub-board 212, the second part of the side wall of the chassis of the server, the second part of the upper wall, the second part of the lower wall, and the air baffle 213. A cross section of the second air cavity is in a right-angled trapezoid shape.

It should be noted that, in FIG. 2, a side wall that is of the chassis and that encloses the first air cavity and a side wall that is of the chassis and that encloses the second air cavity are on different sides.

A hole may be disposed in the area enclosing the second air cavity in any one of the following manners:

Manner 1: A third hole is disposed in the second part of the second sub-board (namely, the area that is on the second sub-board and that encloses the second air cavity), and a fourth hole is disposed in the second part of the side wall of the chassis. In this case, in the second air cavity, airflow enters the second air cavity from the fourth hole, and flows out of the second air cavity through the third hole.

Manner 2: The third hole is disposed in the second part of the second sub-board, the fourth hole is disposed in the second part of the side wall of the chassis, and a fifth hole is disposed in the second part of the upper wall of the chassis. In this case, in the second air cavity, the airflow enters the second air cavity from the fourth hole and/or the fifth hole, and flows out of the second air cavity through the third hole.

Optionally, a hole opening rate of the first sub-board 211 is greater than a first hole opening rate threshold, and a hole opening rate of the second sub-board 212 is greater than a second hole opening rate threshold. The hole opening rate of the first sub-board is used to indicate a ratio of a sum of areas of all holes on the first sub-board to an area of the first sub-board, and the hole opening rate of the second sub-board is used to indicate a ratio of a sum of areas of all holes on the second sub-board to an area of the second sub-board.

Optionally, when the areas of all the holes are the same, the hole opening rate of the first sub-board may also indicate a quantity of holes per unit area of the first sub-board. Similarly, the hole opening rate of the second sub-board may also indicate a quantity of holes per unit area of the second sub-board.

It should be understood that the first hole opening rate threshold or the second hole opening rate threshold may be a maximum hole opening rate of an existing single-layer backplane or a closely-bonded two layers of backplanes. For example, based on a service requirement, the first hole opening rate threshold and the second hole opening rate threshold are 20%.

In a single-layer backplane structure of a conventional server, a signal and a power supply need to be routed on the backplane at the same time. Therefore, there is limitation on opening a hole, and a hole opening rate is relatively small, for example, is only 10%. However, in this embodiment, in a two-layer structure design, the signal and the power supply are separately routed on different sub-boards, and less routing is required on a single sub-board. Therefore, in this embodiment, there is less limitation on opening a hole, and the hole opening rate is increased. Because the hole opening rate of the sub-board in this embodiment is relatively large, resistance of the air cavity to the airflow can be reduced. This ensures smooth airflow in the chassis and improves heat dissipation performance of the server.

It should be understood that, during actual application, a specific value of the first hole opening rate threshold and that of the second hole opening rate threshold may be determined based on an actual situation.

As shown in FIG. 2, the first sub-board 211, the second sub-board 212, and the upper wall and the lower wall of the chassis 220 divide space inside the chassis into two parts: first space and second space. Similar to a manner in which the first module and the second module are connected to the chassis in FIG. 1, in the first space, the first module is connected to the first sub-board by using an interface of the first sub-board, and is specifically connected to the first sub-board by using the interface that is of the first sub-board and that is in the air intake vent area of the first air cavity. In the second space, the second module is connected to the second sub-board by using an interface of the second sub-board, and is specifically connected to the second sub-board by using the interface that is of the second sub-board and that is in the air exhaust vent area of the second air cavity. The air intake vent area of the first air cavity is an area in which the airflow enters into the first air cavity. The air exhaust vent area of the second air cavity is an area in which the airflow flows out of the second air cavity.

For example, as shown in FIG. 2, an air intake vent of the first air cavity is the first hole in the first sub-board, and the air intake vent area of the first air cavity may be represented as a circular area, in the first space, which uses the first hole as a center and uses a preset length as a radius. Alternatively, the air intake vent area of the first air cavity may be represented as a square area or a rectangular area that uses the first hole as the center and uses the preset length as a side length. An air exhaust vent of the second air cavity is the third hole in the second sub-board, and the air exhaust vent area of the second air cavity may be represented as a circular area, in the second space, which uses the third hole as a center and uses a preset length as a radius. Alternatively, the air exhaust vent area of the second air cavity may be represented as a square area or a rectangular area that uses the third hole as the center and uses the preset length as a side length. When there are a plurality of first holes in the first space, the air intake vent area of the first air cavity may be a circular area or an area in another shape (for example, a square or a rectangle) that is determined according to a preset algorithm and that uses an area enclosed by the plurality of first holes as a center, to ensure that the airflow to the first air cavity may pass through the first module in the area. Similarly, when there are a plurality of third holes in the second space, the air exhaust vent area of the second air cavity may be a circular area or an area in another shape (for example, a square or a rectangle) that is determined according to a preset algorithm and that uses an area enclosed by the plurality of third holes as a center, to ensure that the airflow in the second air cavity may pass through the second module in the area.

When the at least one first module is connected to the chassis by using the first sub-board, the first air cavity is used for the at least one first module to dissipate heat. Specifically, the airflow enters the chassis from a side that is of the chassis and that is close to the first sub-board, passes through the at least one first module, enters the first air cavity through the first hole in the first sub-board, and then flows out of the first air cavity through the second hole in the second sub-board. In this way, heat of the at least one first module is taken out of the chassis.

It should be understood that a system heat dissipation fan (not shown in the figure) is disposed in a tail part (a right side of the second sub-board) of the chassis. The system heat dissipation fan mainly controls a direction of the airflow that passes through the at least one first module, so that the airflow may pass through the first module in the described direction and take the heat out of the chassis.

For the second module, because each second module is provided with an independent fan, the fan may be configured to control a direction of the airflow that passes through the second module. Specifically, when the hole in the second air cavity is disposed in the manner 1, the airflow enters the second air cavity from the fourth hole in the side wall of the chassis, then flows out of the second air cavity through the third hole in the second sub-board, and flows out of the chassis after passing through the at least one second module, to take heat of the at least one second module out of the chassis. When the hole in the second air cavity is disposed in the manner 2, the airflow enters the second air cavity from the fifth hole in the upper wall of the chassis and/or the fourth hole in the side wall, then flows out of the second air cavity through the third hole in the second sub-board, and flows out of the chassis after passing through the at least one second module, to take the heat of the at least one second module out of the chassis.

Compared with a heat dissipation structure of a chassis of the conventional server, in this embodiment, the backplane is disposed as a structure of two isolated sub-boards, so that a cavity is formed between the two sub-boards. At least one air baffle is disposed between the two sub-boards, to divide the cavity into the first air cavity that is used for the first module to dissipate heat and the second air cavity that is specially used for the second module to dissipate heat. In other words, in this embodiment, the first module and the second module each have an independent heat dissipation air cavity. Therefore, independent heat dissipation of the first module and the second module is implemented. This improves heat dissipation efficiency of the first module and that of the second module, and further improves heat dissipation performance of the entire server.

The following further describes, with reference to FIG. 6, the chassis of the server provided in this embodiment. A difference between FIG. 6 and FIG. 2 lies in that in FIG. 6, space enclosed by the first sub-board, the second sub-board, the upper wall of the chassis, and the lower wall of the chassis is divided into one first air cavity and two second air cavities by using two air baffles.

Specifically, as shown in FIG. 6, the chassis 220 of the server 200 includes the backplane 210, and the backplane 210 further includes the first sub-board 211, the second sub-board 212, and two air baffles 213. The first sub-board 211 is isolated from the second sub-board 212, the first sub-board 211 is parallel to the second sub-board 212, and both the first sub-board 211 and the second sub-board 212 are perpendicular to the side wall of the chassis of the server. As shown in FIG. 6, the two air baffles 213 are located between the first sub-board 211 and the second sub-board 212, and each of the two air baffles 213 forms an included angle with the first sub-board 211 and forms an included angle with the second sub-board 212. The two air baffles 213 may be disposed symmetrically by using a central axis of the chassis of the server as a reference, or may be disposed asymmetrically.

Space enclosed by the first sub-board 211, the second sub-board 212, and the side wall, the upper wall, and the lower wall of the chassis 220 is divided into one first air cavity and two second air cavities by using the two air baffles 213. A hole used for air circulation is disposed in an area enclosing the first air cavity, and the first air cavity is used for at least one first module to dissipate heat. Each first module is connected to the first sub-board by using an interface that is of the first sub-board and that is in the air intake vent area of the first air cavity. A hole used for air circulation is disposed in an area enclosing each of the second air cavity, and the second air cavity is used for at least one second module to dissipate heat. Each second module is connected to the second sub-board by using an interface that is of the second sub-board and that is in an air exhaust vent area of the second air cavity. Two included angles are respectively formed between the air baffle 213 and the first sub-board and between the air baffle 213 and the second sub-board. A first included angle is formed between the air baffle 213 and the first sub-board 211, and a second included angle is formed between the air baffle 213 and the second sub-board 212.

The chassis in FIG. 6 includes the two second air cavities. Therefore, two groups of second modules may be disposed in the chassis of the server, and each group of second modules may include at least one second module. Each second air cavity may correspond to one group of second modules, and each second air cavity is used for a corresponding group of second modules to dissipate heat. The chassis in FIG. 2 includes one second air cavity. Therefore, only one group of second modules may be disposed in the chassis of the server, and the one second air cavity may be used for the one group of second modules to dissipate heat.

As shown in FIG. 6, the difference between FIG. 6 and FIG. 2 further lies in that a part enclosing the first air cavity in FIG. 6 may not include the side wall of the chassis, and a part enclosing the first air cavity in FIG. 2 needs to include the side wall of the chassis. Specifically, the first air cavity in FIG. 6 is enclosed by the two air baffles 213, a first part of the first sub-board 211, a first part of the second sub-board 212, a first part of the upper wall of the chassis, and a first part of the lower wall of the chassis. The first air cavity in FIG. 2 is enclosed by the air baffle 213, the first part of the first sub-board 212, the first part of the second sub-board 212, and the first part of the side wall of the chassis.

It should be understood that structures of the two second air cavities in FIG. 6 are similar to the structure of the second air cavity in FIG. 2, and the two second air cavities may be disposed symmetrically by using the central axis of the chassis of the server as a reference. With reference to FIG. 3, the following describes an airflow direction by using the structure of one second air cavity. Because the structures of the two second air cavities are symmetrical, for the structure and an airflow direction of the other second air cavity, refer to the description of the one second air cavity. To avoid repetition, details are not described herein again.

As shown in FIG. 6, the first sub-board 211, the second sub-board 212, and the upper wall and the lower wall of the chassis 220 divide space inside the chassis into two parts: first space and second space. Similar to the manner in which the first module and the second module are connected to the chassis in FIG. 1, in the first space, the first module is connected to the first sub-board by using an interface of the first sub-board, and is specifically connected to the first sub-board by using the interface that is of the first sub-board and that is in the air intake vent area of the first air cavity. In the second space, the second module is connected to the second sub-board by using an interface of the second sub-board, and is specifically connected to the second sub-board by using the interface that is of the second sub-board and that is in the air exhaust vent area of the second air cavity. The second modules in FIG. 6 may be classified into two groups. One group of second modules is disposed in the air exhaust vent area of the one second air cavity, and the other group of second modules is disposed in the air exhaust vent area of the other second air cavity. The air intake vent area of the first air cavity is an area in which airflow enters into the first air cavity. The air exhaust vent area of the second air cavity is an area in which the airflow flows out of the second air cavity.

When the at least one first module is connected to the chassis by using the first sub-board, the first air cavity is used for the at least one first module to dissipate heat. Specifically, the airflow enters the chassis from a side that is of the chassis and that is close to the first sub-board, passes through the at least one first module, enters the first air cavity through a first hole in the first sub-board, and then flows out of the first air cavity through a second hole in the second sub-board. In this way, heat of the at least one first module is taken out of the chassis.

It should be understood that a system heat dissipation fan (not shown in the figure) is disposed in a tail part (a right side of the second sub-board) of the chassis. The system heat dissipation fan mainly controls a direction of the airflow that passes through the at least one first module, so that the airflow may pass through the first module in the described direction and take the heat out of the chassis.

For the second module, because the second module is provided with an independent fan, the fan may be configured to control a direction of airflow that passes through the second module. Specifically, when the hole in the second air cavity is disposed in the manner 1, the airflow enters the second air cavity from a fourth hole in the side wall of the chassis, then flows out of the second air cavity through a third hole in the second sub-board, and flows out of the chassis after passing through the at least one second module, to take heat of the at least one second module out of the chassis. When the hole in the second air cavity is disposed in the manner 2, the airflow enters the second air cavity from a fifth hole in the upper wall of the chassis and/or the fourth hole in the side wall, then flows out of the second air cavity through the third hole in the second sub-board, and flows out of the chassis after passing through the at least one second module, to take the heat of the at least one second module out of the chassis.

Compared with a heat dissipation structure of the conventional server, in this embodiment, the backplane is disposed as a structure of two isolated sub-boards, so that a cavity is formed between the two sub-boards. At least one air baffle is disposed between the two sub-boards, to divide the cavity into the first air cavity that is used for the first module to dissipate heat and the second air cavity that is specially used for the second module to dissipate heat. In other words, in this embodiment, the first module and the second module each have an independent heat dissipation air cavity. Therefore, independent heat dissipation of the first module and the second module is implemented. This improves heat dissipation efficiency of the first module and that of the second module, and further improves heat dissipation performance of the entire server.

The foregoing describes, with reference to FIG. 2, an example in which the chassis has one air baffle, and describes, with reference to FIG. 6, an example in which the chassis has two air baffles. However, this is not limited in this embodiment. Similar to the example in FIG. 2 or FIG. 6, the chassis of the server in this embodiment may include more air baffles.

For example, the chassis of the server has three or more air baffles. As shown in FIG. 7, when there are three air baffles 213 in the chassis of the server, the three air baffles 213 may be located between the first sub-board 211 and the second sub-board 212. Each of the three air baffles forms an included angle with the first sub-board and forms an included angle with the second sub-board. Space enclosed by the first sub-board 211, the second sub-board 212, and the side wall, the upper wall, and the lower wall of the chassis is divided into four air cavities by using the three air baffles, and the four air cavities may include one first air cavity and three second air cavities. In a possible implementation, as shown in FIG. 7, structures of two of the three second air cavities, namely, a 1st second air cavity and a 2nd second air cavity, may be similar to the structures of the two second air cavities in FIG. 6. A 3rd second air cavity may be enclosed by two of the three air baffles, and the upper wall and the lower wall of the chassis. An air intake vent of the 3rd second air cavity is a hole in the upper wall of the chassis, and an air exhaust vent is a hole in the second sub-board. Similarly, one group of second modules corresponding to the 3rd second air cavity may be connected to the second sub-board by using an interface that is of the second sub-board and that is in an air exhaust vent area of the second air cavity. Specifically, for an airflow direction in the second air cavity, refer to the foregoing descriptions in FIG. 2 and FIG. 6. To avoid repetition, details are not described herein again.

When more air baffles (for example, four, five, and the like) are disposed in the chassis of the server, a structure of a second air cavity is similar to structures of the second air cavities enclosed by the three air baffles. To avoid repetition, details are not described herein again.

The examples of values in the foregoing embodiment are intended to help a person skilled in the art better understand the embodiments, but are not intended to limit the scope of the disclosure.

Content in the embodiments of the present application may be combined with each other, and this embodiment is not limited thereto.

The chassis in FIG. 2 to FIG. 7 are merely intended to help a person skilled in the art understand the embodiments, instead of limiting the embodiments to illustrated specific values or specific scenarios in the examples. A person skilled in the art certainly can make various equivalent modifications or changes according to the examples given in FIG. 2 and FIG. 7, and such modifications or changes also fall within the protection scope of the embodiments.

Figure 8:
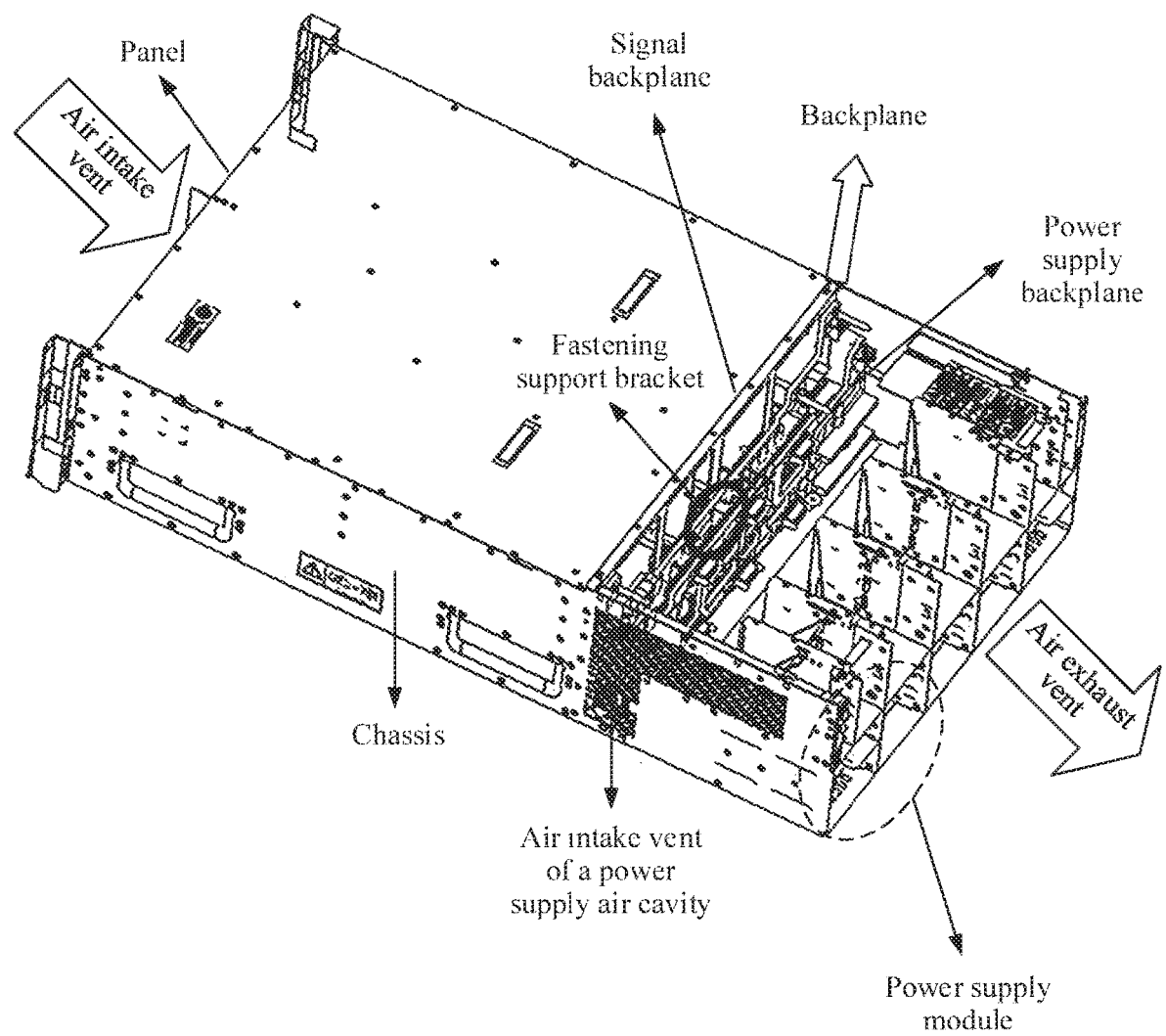
FIG. 8 is a schematic structural diagram of a blade server according to an embodiment.

The foregoing describes a structure of the chassis of the server in the embodiments with reference to FIG. 2 to FIG. 7. With reference to FIG. 8, the following further describes a heat dissipation structure provided in an embodiment by using an example in which a server is a blade server.

As shown in FIG. 8, the blade server includes a chassis, at least one first module, and at least one second module. The chassis includes a backplane. The backplane is disposed in the chassis, and the backplane includes a first sub-board, a second sub-board, and at least one air baffle. A power supply module corresponds to the second module of the server shown in FIG. 2, FIG. 6, and FIG. 7, a power supply backplane corresponds to the second sub-board shown in FIG. 2, FIG. 6, and FIG. 7, a computation module corresponds to the first module of the server shown in FIG. 2, FIG. 6, and FIG. 7, and a signal backplane corresponds to the first sub-board shown in FIG. 2, FIG. 6, and FIG. 7. In this layout, when a fan of the power supply module works, cooling airflow enters the power supply air cavity through a hole in a side wall of the chassis, and flows out of the power supply air cavity through a hole in the power supply backplane. Then, the cooling airflow passes through the power supply module and flows out through a power fan, to take heat of the power supply module away. When a system fan of the server works, the cooling airflow may enter the chassis through an inlet (for example, an air intake vent disposed on a panel) at a front end of the chassis, and when passing through the computation module, the cooling airflow takes heat of the computation module away. Then the airflow carrying the heat of the computation module enters a system air cavity through an air intake vent of the system air cavity, and flows out of the system air cavity through an air exhaust vent of the system air cavity, to take the heat of the computation module out of the chassis.

It should be understood that the power supply backplane may be configured to be connected to the power supply module, and convert a voltage to supply power to modules in the chassis. The signal backplane may be used for communication between the modules in the chassis.

In this embodiment, because the power supply module has the fan, and the power supply module is provided with an independent air cavity, namely, the power supply air cavity, the fan of the power supply module may control the airflow to enter into and flow out of the power supply air cavity, to dissipate heat for the power supply module. Specifically, in this embodiment, the power supply module may be connected to the power supply backplane, and the computation module may be connected to the signal backplane. The power supply module may be disposed at an air exhaust vent of the power supply air cavity, and the computation module may be disposed at a position in front of the air intake vent of the system air cavity in the chassis. The power supply module corresponds to the second module of the server shown in FIG. 2, FIG. 6, and FIG. 7, the power supply backplane corresponds to the second sub-board shown in FIG. 2, FIG. 6, and FIG. 7, the computation module corresponds to the first module of the server shown in FIG. 2, FIG. 6, and FIG. 7, and the signal backplane corresponds to the first sub-board shown in FIG. 2, FIG. 6, and FIG. 7. In this layout, when the fan of the power supply module works, the cooling airflow enters the power supply air cavity through the hole in the side wall of the chassis, and flows out of the power supply air cavity through the hole in the power supply backplane. Then, the cooling airflow passes through the power supply module and flows out through the power fan, to take the heat of the power supply module away. When the system fan of the server works, the cooling airflow may enter the chassis through the inlet (for example, the air intake vent disposed on the panel) at the front end of the chassis, and when passing through the computation module, the cooling airflow takes the heat of the computation module away. Then the airflow carrying the heat of the computation module enters the system air cavity through the air intake vent of the system air cavity, and flows out of the system air cavity through the air exhaust vent of the system air cavity, to take the heat of the computation module out of the chassis.

Specifically, for a specific structure of the chassis, a heat dissipation process in the chassis, and beneficial effects that can be implemented, refer to the foregoing descriptions in FIG. 2 to FIG. 8. To avoid repetition, details are not described herein again.

In this embodiment, the power supply air cavity is specially used for the power supply module to dissipate heat, and the system air cavity is specially used for the computation module to dissipate heat. This avoids a problem that the power supply module and the computation module are coupled together to dissipate heat by using a same air cavity. Therefore, in this embodiment, a heat dissipation structure of the power supply module can be decoupled from that of the computation module, to implement independent heat dissipation of the power supply module and the computation module. This avoids heat accumulation between the power supply module and the computation module, and improves heat dissipation performance of the server.

In a possible embodiment, this embodiment may be further applied to a rack server. The rack server includes at least one first module and at least one second module. The chassis includes a backplane. The backplane is disposed in the chassis, and the backplane includes a first sub-board, a second sub-board, and at least one air baffle. A specific heat dissipation structure and a heat dissipation process are similar to those in FIG. 8. To avoid repetition, details are not described herein again.

"One embodiment" or "an embodiment" mentioned in the entire specification means that particular features, structures, or characteristics related to the embodiment are included in at least one embodiment of the present disclosure. Therefore, "in one embodiment" or "in an embodiment" appearing throughout the entire specification does not necessarily refer to a same embodiment. In addition, these particular features, structures, or characteristics may be combined in one or more embodiments in any appropriate manner.

It should be further understood that, in the embodiments, "first", "second" "third", and "fourth" are only for distinguishing between pixels, and should not constitute any limitation on the protection scope of the present disclosure.

The term "and/or" in this specification describes only an association relationship for describing associated objects and represents that there may be three relationships. For example, A and/or B may represent the following three cases: Only A exists, both A and B exist, and only B exists. In addition, the character "/" in this specification usually indicates an "or" relationship between the associated objects.

It should be understood that in the embodiments, "B corresponding to A" indicates that B is associated with A, and B may be determined based on A. However, it should further be understood that determining B based on A does not mean that B is determined based on A only. B may alternatively be determined based on A and/or other information.

A person of ordinary skill in the art may be aware that, units and algorithm steps of the examples described in combination with the embodiments disclosed in this specification may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this disclosure.

It may be clearly understood by a person skilled in the art that, for convenient and brief description, for a detailed working process of the foregoing system, apparatus, and unit, refer to a corresponding process in the foregoing method embodiments, and details are not described herein again.

In a plurality of embodiments provided, it should be understood that the disclosed system, apparatus, and method may be implemented in another manner. For example, the described apparatus embodiments are merely examples. For example, division into the units is merely logical function division and may be other division in actual implementation. For example, a plurality of units or components may be combined or integrated into another system, or some features may be ignored or not performed. In addition, the displayed or discussed mutual coupling or a direct coupling or a communication connection may be implemented by using some interfaces. An indirect coupling or a communication connection between the apparatuses or units may be implemented in an electronic form, a mechanical form, or in another form.

The units described as separate parts may or may not be physically separate, and parts displayed as units may or may not be physical units, may be located in one position, or may be distributed on a plurality of network units. Some or all of the units may be selected based on an actual requirement to achieve the objectives of the solutions in the embodiments.

In addition, functional units in the embodiments may be integrated into one processing unit, or each of the units may exist alone physically, or two or more units may be integrated into one unit.

The foregoing descriptions are merely specific implementations, but are not intended to limit a protection scope of this disclosure. Any variation or replacement readily figured out by a person skilled in the art within the technical scope disclosed shall fall within the protection scope of this disclosure. Therefore, the protection scope of this disclosure shall be subject to the protection scope of the claims.

What is claimed is:

1. A server chassis comprising:
   a side wall;
   a lower wall;
   an upper wall; and
   a backplane comprising:
      a first sub-board perpendicular to the side wall and comprising a first interface configured to couple to a first module, a second sub-board isolated from the first sub-board, parallel to the first sub-board, perpendicular to the side wall, and comprising a second interface configured to couple to a second module, an air baffle located between the first sub-board and the second sub-board, forming a first included angle with the first sub-board, and forming a second included angle with the second sub-board, and space enclosed by the side wall, the lower wall, the upper wall, the first sub-board, and the second sub-board and comprising:

a first air cavity configured to dissipate heat from the first module, comprising a first hole configured to provide air circulation, and comprising an air intake vent area disposing the first interface within, and a second air cavity configured to dissipate heat from the second module, comprising a second hole configured to provide air circulation, and comprising an air exhaust vent area disposing the second interface within.

2. The server chassis of claim 1, wherein the air baffle intersects with the side wall, the second air cavity is enclosed by a first part of the side wall, a second part of the lower wall, a third part of the upper wall, a fourth part of the second sub-board, and the air baffle.

3. The server chassis of claim 2, wherein the first air cavity is enclosed by a fifth part of the side wall, a sixth part of the lower wall, a seventh part of the upper wall, the first sub-board, an eighth part of the second sub-board, and the air baffle or the first air cavity is enclosed by the sixth part, the seventh part, the first sub-board, the eighth part, and the air baffle, and wherein the first air cavity comprises:

a third hole disposed on the first sub-board and configured to allow air to enter the first air cavity; and a fourth hole disposed in the eighth part and configured to allow the air to exit the first air cavity.

4. The server chassis of claim 1, wherein the air baffle does not intersect with the side wall, the second air cavity is enclosed by a first part of the side wall, a second part of the lower wall, a third part of the upper wall, a fourth part of the first sub-board, a fifth part of the second sub-board, and the air baffle.

5. The server chassis of claim 4, wherein the first air cavity is enclosed by a sixth part of the lower wall, a seventh part of the upper wall, an eighth part of the first sub-board, a ninth part of the second sub-board, and the air baffle or the first air cavity is enclosed by the sixth part, the seventh part, the eighth part, the ninth part, and the air baffle, and wherein the first air cavity comprises:

a third hole disposed in the eighth part and configured to allow air to enter the first air cavity; and a fourth hole disposed in the ninth part and configured to allow the air to exit the first air cavity.

6. The server chassis of claim 1, wherein the second hole comprises:

a third hole disposed in a first part of the second sub-board and configured to allow air to exit the second air cavity; and a fourth hole disposed in a second part of the side wall and configured to allow the air to enter the second air cavity.

7. The server chassis of claim 1, wherein the second hole comprises:

a third hole disposed in a first part of the second sub-board and configured to allow air to exit the second air cavity;

a fourth hole disposed in a second part of the side wall and configured to allow the air to enter the second air cavity; and a fifth hole disposed in a third part of the upper wall and configured to allow the air to enter the second air cavity.

8. The server chassis of claim 1, wherein a spacing between the first sub-board and the second sub-board is related to a size of the server chassis or a module layout inside the server chassis.

9. The server chassis of claim 1, further comprising a bulbar component coupling the first sub-board to the second sub-board and configured to supply power to the second sub-board.

10. A server chassis comprising:
a side wall;
a lower wall;
an upper wall;
a backplane comprising:
a first sub-board perpendicular to the side wall and comprising a first interface configured to couple to a first module,
a second sub-board isolated from the first sub-board, parallel to the first sub-board, perpendicular to the side wall, and comprising a second interface configured to couple to a second module,
an air baffle located between the first sub-board and the second sub-board, forming a first included angle with the first sub-board, and forming a second included angle with the second sub-board, and
space enclosed by the side wall, the lower wall, the upper wall, the first sub-board, and the second sub-board and comprising:
a first air cavity configured to dissipate heat from the first module, comprising a first hole configured to provide air circulation, and comprising an air intake vent area disposing the first interface within, and
a second air cavity configured to dissipate heat from the second module, comprising a second hole configured to provide air circulation, and comprising an air exhaust vent area disposing the second interface within; and
a fastening support bracket disposed between the first sub-board and the second sub-board and configured to fasten the first sub-board to the second sub-board to form a spacing between the first sub-board and the second sub-board.

11. The server chassis of claim 1, wherein a first hole opening rate of the first sub-board is greater than a first hole opening rate threshold, wherein a second hole opening rate of the second sub-board is greater than a second hole opening rate threshold, wherein the first hole opening rate indicates a first ratio of a first sum of areas of all holes on the first sub-board to a first area of the first sub-board, and wherein the second hole opening rate indicates a second ratio of a second sum of areas of all holes on the second sub-board to a second area of the second sub-board.

12. A server comprising:
a first module;
a second module; and
a server chassis comprising:
a side wall,
a lower wall,
an upper wall, and
a backplane comprising:

a first sub-board perpendicular to the side wall and comprising a first interface configured to couple to the first module, a second sub-board isolated from the first sub-board, parallel to the first sub-board, perpendicular to the side wall, and comprising a second interface configured to couple to the second module, an air baffle located between the first sub-board and the second sub-board, forming a first included angle with the first sub-board, and forming a second included angle with the second sub-board, and space enclosed by the side wall, the lower wall, the upper wall, the first sub-board, and the second sub-board and comprising:

a first air cavity configured to dissipate heat from the first module, comprising a first hole configured to provide air circulation, and comprising an air intake vent area disposing the first interface within, and a second air cavity configured to dissipate heat from the second module, comprising a second hole configured to provide air circulation, and comprising an air exhaust vent area disposing the second interface within.

13. The server of claim 12, wherein when the air baffle intersects with the side wall, the second air cavity is enclosed by a first part of the side wall, a second part of the lower wall, a third part of the upper wall, a fourth part of the second sub-board, and the air baffle.

14. The server of claim 13, wherein the first air cavity is enclosed by a fifth part of the side wall, a sixth part of the lower wall, a seventh part of the upper wall, the first sub-board, an eighth part of the second sub-board, and the air baffle or the first air cavity is enclosed by the sixth part, the seventh part, the first sub-board, the eighth part, and the air baffle, and wherein the first air cavity comprises:

a third hole disposed on the first sub-board and configured to allow air to enter the first air cavity; and a fourth hole disposed in the eighth part and configured to allow the air to exit the first air cavity.

15. The server of claim 12, wherein when the air baffle does not intersect with the side wall, the second air cavity is enclosed by a first part of the side wall, a second part of the lower wall, a third part of the upper wall, a fourth part of the first sub-board, a fifth part of the second sub-board, and the air baffle.

16. The server of claim 15, wherein the first air cavity is enclosed by a sixth part of the lower wall, a seventh part of the upper wall, an eighth part of the first sub-board, a ninth part of the second sub-board, and the air baffle or the first air cavity is enclosed by the sixth part, the seventh part, the eighth part, the ninth part, and the air baffle, and wherein the first air cavity comprises:

a third hole disposed in the eighth part and configured to allow air to enter the first air cavity; and a fourth hole disposed in the ninth part and configured to allow the air to exit the first air cavity.

17. The server of claim 12, wherein the second hole comprises:

a third hole disposed in a first part of the second sub-board and configured to allow air to exit the second air cavity; and a fourth hole disposed in a second part of the side wall and configured to allow the air to enter the second air cavity.

18. The server of claim 12, wherein the second hole comprises:

a third hole disposed in a first part of the second sub-board and configured to allow air to exit the second air cavity;

a fourth hole disposed in a second part of the side wall and configured to allow the air to enter the second air cavity; and a fifth hole disposed in a third part of the upper wall and configured to allow the air to enter the second air cavity.

19. The server of claim 12, wherein the server chassis further comprises a fastening support bracket disposed between the first sub-board and the second sub-board and configured to fasten the first sub-board to the second sub-board to form a spacing between the first sub-board and the second sub-board.

20. The server of claim 12, wherein a first hole opening rate of the first sub-board is greater than a first hole opening rate threshold, wherein a second hole opening rate of the second sub-board is greater than a second hole opening rate threshold, wherein the first hole opening rate indicates a first ratio of a first sum of areas of all holes on the first sub-board to a first area of the first sub-board, and wherein the second hole opening rate indicates a second ratio of a second sum of areas of all holes on the second sub-board to a second area of the second sub-board.

* * * * *